United States Patent [19]
Lin

[11] 3,893,152
[45] July 1, 1975

[54] METAL NITRIDE OXIDE SEMICONDUCTOR INTEGRATED CIRCUIT STRUCTURE

[76] Inventor: Hung Chang Lin, 8 Schindler Ct., Silver Spring, Md. 20903

[22] Filed: July 25, 1973

[21] Appl. No.: 382,355

[52] U.S. Cl. ...................... 357/23; 357/44; 357/45; 357/46; 357/49; 307/279; 340/173

[51] Int. Cl. ......................... H01l 11/00; H01l 15/00

[58] Field of Search ......... 317/235, 22, 22.2, 22.11, 317/21.1; 340/173; 307/279

[56] References Cited

UNITED STATES PATENTS 3,691,535 9/1972 Williams ........................ 340/173 PP

FOREIGN PATENTS OR APPLICATIONS 1,160,744 8/1969 United Kingdom ............ 317/235 D

OTHER PUBLICATIONS

IBM Technical Disclosure Bulletin, Vol. 12, No. 1, June, 1969, by Gregor, Capacitor Storage Cell.

IBM Technical Disclosure Bulletin, by Krick, Vol. 15, No. 2, July, 1972, pp. 466 & 467.

IBM Technical Disclosure Bulletin, Vol. 15, No. 4, Sept., 1972, by Terman, pp. 1227–1229.

Component Technol. MNOS a new non-volatile store, by Oakley; pp. 17 to 21, Oct., 1970, Vol. 4, No. 5.

IEEE International Convention Digest Achieving MOS-Bipolar Compatibility, by M. Kirm, pp. 133 to 135.

*Primary Examiner*—Andrew J. James
*Attorney, Agent, or Firm*—Brady, O'Boyle & Gates

[57] ABSTRACT

Method and apparatus for providing a metal nitride oxide semiconductor (MNOS) memory in the form of a matrix array of either capacitors and/or transistors having polarizing potentials applied thereto for representing one of two binary logic states. Structurally, the array is comprised of a thin epitaxial layer of one type, for example *n*-type semiconductivity grown on a substrate of opposite or *p*-type semiconductivity. Parallel rows of silicon dioxide are infused into the epitaxial layer to provide strip regions of isolation between separated regions of first conductivity also forming substantially parallel rows. Transversely to the parallel sublayer rows of *n*-type semiconductivity and silicon dioxide isolation are a plurality of parallel columns of common gates, either metal or silicon. The columns of gates are separated from the parallel rows of *n*-type semiconductivity by intermediate contiguous layers of silicon dioxide and silicon nitride. Such a configuration describes a matrix array of capacitors; however, a matrix of transistors is formed by additionally diffusing a dopant of for example *p*+type semiconductivity into the regions of *n*-type semiconductivity on either side of the parallel columns of common gates.

10 Claims, 15 Drawing Figures

METAL NITRIDE OXIDE SEMICONDUCTOR INTEGRATED CIRCUIT STRUCTURE

BACKGROUND OF THE INVENTION

This invention relates generally to integrated semiconductor circuit elements, and more particularly to MNOS devices fabricated in a high density memory array.

Metal nitride oxide semiconductive devices and their principle of operation are well known. For example, U.S. Pat. No. 3,549,911, Scott, discloses such devices. Also a publication appearing in the *RCA Review*, June, 1970, at pages 342–354, entitled "Optimization of Charge Storage in the MNOS Memory Device", Goodman, et al. further discloses such a device utilized in a memory.

Briefly, when a large positive polarizing potential is applied between the gate and the semiconductor substrate of a MNOS device, electrons will tunnel through the thin oxide layer (usually silicon dioxide) and rest at the oxide-nitride interface under the influence of a high electric field. When electrons are removed from the underlying semiconductor, the conductivity of the semiconductor changes. If the semiconductor is of *n*-type material, the removal of electrons may invert the semiconductor into *p*-type material. Once the electrons are trapped at the interface, they will remain there even after removal of the polarizing voltage because the dielectric is non-conductive. This retention characteristic is known as non-volatile retention.

Next if a large negative polarizing voltage is applied to the gate with respect to the semiconductor substrate, the electrons trapped at the interface return to the substrate. Accordingly, the capacitance between the metal gate and the semiconductor substrate of an MNOS device can be varied by a polarizing voltage of either positive or negative polarity with the amount of polarization being a function not only of the voltage amplitude, but also a function of the polarization duration. For a shorter duration, a higher polarization is required because the time must be allowed for the electrons to be embedded into the dielectric. This is analogous to charging a capacitor in which the final charge depends upon the charging voltage and the duration.

SUMMARY

Briefly, the subject invention comprises an improved integrated circuit structure comprised of MNOS device fabricated on a substrate of first type semiconductor material. An epitaxial layer of second type semiconductor material is fabricated on the substrate in parallel regions in the form of rows separated by contiguous intermediate dielectric isolation regions comprised of for example, silicon dioxide and wherein the parallel rows of semiconductive material and intermediate silicon dioxide form a planar surface over which a plurality of parallely disposed transverse columns of MNOS gates are provided, the gates being comprised of sandwiched layers of silicon dioxide, silicon nitride and gate material, either aluminum or silicon. Such a configuration provides an array of MNOS capacitors; however, by an additional diffusion of a selected impurity dopant into the rows of second type semiconductor material on each side of the common gates there is provided an MNOS transistor array. The invention further includes the method steps for fabricating both the capacitor and transistor arrays.

DESCRIPTION OF THE PREFERRED EMBODIMENTS

Figure 1:
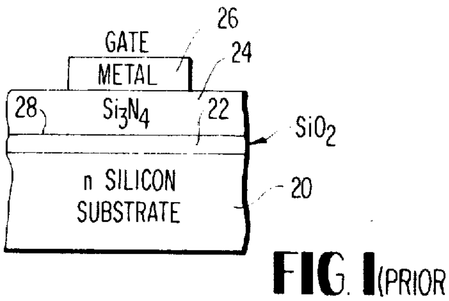
FIG. 1 (PRIOR ART)
FIG. 1 is a partial sectional view of an MNOS capacitor typical of the prior art.
Figure 3:
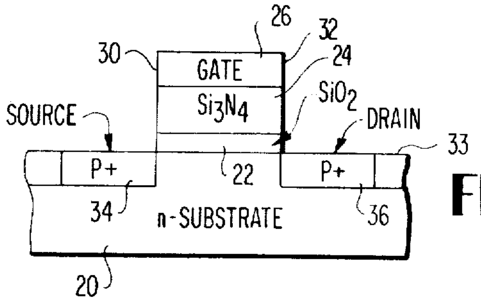
FIG. 3 (PRIOR ART)
FIG. 3 is a partial sectional view illustrative of an MNOS transistor typical of the prior art.

Referring now briefly to FIGS. 1 and 3, the structures shown therein are typically illustrative of MNOS (metal nitride oxide semiconductor) devices, the first being an MNOS capacitor (FIG. 1) and the second being an MNOS transistor (FIG. 3). The capacitor is formed by means of a semiconductor substrate 20 typically of n type silicone upon which is fabricated a dielectric layer 22 of silicon dioxide ($SiO_2$). Next a second dielectric layer 24 comprised of silicon nitride ($Si_3N_4$) is formed over the silicon dioxide layer 22. A layer of gate material 26 suitably configured and comprised of either metal or silicon is formed on the silicon nitride layer 24.

A capacitor is formed between the gate 26 and the substrate 20 such that when a polarizing potential is applied to the gate 26 with respect to the semiconductor substrate 20, electrons will tunnel through the oxide layer 22 and rest at the oxide-nitride interface 28 under the influence of a high electric field. Once the electrons are trapped at the interface 28, they will remain there even after the removal of the polarizing voltage. Subsequently, if a polarizing voltage of the opposite polarity is applied to the gate 26 with respect to the semiconductor substrate 20, the electrons trapped at the interface 28 return to the semiconductor substrate. The amount of charges embedded in the dielectric affects the capacitance as shown in FIG. 2.

Figure 2:
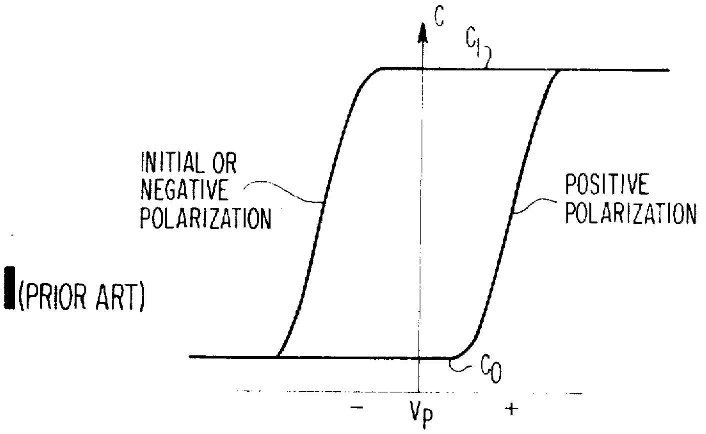
FIG. 2 is a characteristic curve illustrative of the change in capacitance obtainable in an MNOS capacitor as a function of a polarizing voltage.

FIG. 2 is a characteristic curve illustrating the relationship of the capacitance of an MNOS device with respect to a polarizing voltage applied thereto. It should be noted that the capacitance at zero potential between the gate and source changes from a minimum value of $C_0$ after an initial or negative polarization voltage to a maximum value of $C_1$ following a positive polarization. Furthermore, any capacitance between these values can be adjusted by the proper amount of polarization. The amount of polarization is not only a function of the voltage, but also a function of the polarization duration. For shorter duration, however, a higher polarizing voltage is required because time must be allowed for the electrons to become embedded in the dielectric. This is analogous to charging the capacitor wherein the final charge storage depends on the charging voltage and the duration. Thus by controlling the polarizing voltage and/or duration, one can adjust the value of the capacitance. It immediately becomes evident from the hysteresis type curve of FIG. 2, that the two limits $C_0$ and $C_1$ lend the device particularly useful for binary digital applications where for example a binary 1 is signified by the capacitance value $C_1$ and a binary 0 is signified by the capacitance value $C_0$.

The MNOS transistor is structurally similar to the MNOS capacitor; however, a source and drain region must be diffused into the substrate on each side of the gate. Such a device is shown in FIG. 3, and includes the substrate 20, the silicon dioxide layer 22, the nitride layer 24, and the gate material 26. The difference between the structures shown in FIGS. 1 and FIG. 3 is that the gate 26, the nitride $Si_3N_4$ layer 24 and the oxide $SiO_2$ layer 22 are formed to have substantially the same surface dimensions such that a common side wall 30 and 32 from the top of the gate material to the surface of the substrate 20, is provided. Adjacent the side walls 30 and 32 is a diffusion of a dopant of opposite conductivity, in this case *p*+type impurities, into the surface 33 of the substrate 20 forming a P channel transistor having a source 34 and drain 36. Further, by controlling the voltage applied to the gate 26, the channel resistance between the source 34 and the drain 36 can be varied to represent not only a variable resistance, but may also be representative of two binary resistive logic states similar to the case of the MNOS capacitor.

The MNOS capacitor has the advantage over the MNOS resistor in that only two terminals are required as compared to the three terminals for the MNOS transistor which acts like a resistor. The two terminal capacitor consequently occupies less semiconductive area which is an important consideration in high density integrated circuitry. Thus the MNOS capacitor as shown in FIG. 1 only occupies the area of the gate 26, while the MNOS transistor shown in FIG. 3 requires the additional area of the source and drain regions 34 and 36 over which contact areas must be provided.

Figure 4:
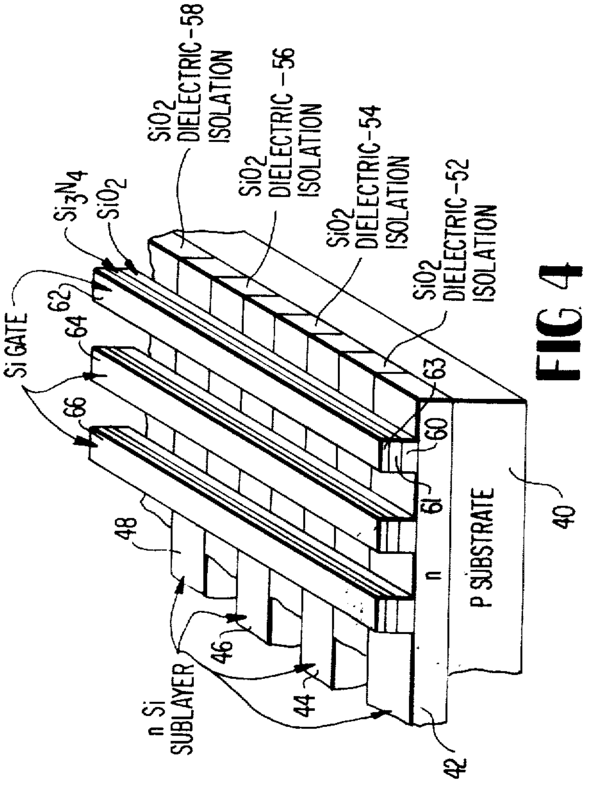
FIG. 4 is a partial perspective view of an MNOS capacitive matrix according to the teachings of the subject invention.

Proceeding now from the priliminary considerations of MNOS capacitor and transistor devices, reference is now directed to the first embodiment of the subject invention shown in FIG. 4, which is adapted to provide an array of MNOS capacitors for use in a high density random access memory. The structure as shown in FIG. 4 includes a substrate 40 of first or *p*-type semiconductor material upon which is fabricated a plurality of parallel rows 42, 44, 46, 48, etc. of second or *n*-type semiconductive material. The rows are of substantially like configuration, having respective outer surfaces lying in a common plane, and having substantially equal separation therebetween. Rows 52, 54, 56, 58, etc. of a dielectric isolation material, preferably silicon dioxide, is formed intermediate the *n*-type semiconductor rows 42, 44, etc. being contiguous therewith and having planar surfaces common with the semiconductor rows to thereby provide a planar outer surface over which there is located a set of parallel columns of MNOS gates 62, 64, 66, etc. arranged transversely to the sublayer rows of semiconductor and dielectric material. Each of the columns of MNOS gates 62, 64 and 66 is comprised of contiguous layers 60 and 61 of oxide ($SiO_2$) and polycrystalline silicon ($Si_3N_4$) respectively with a layer 63 of gate material on top of the $Si_3N_4$ layer 61. This configuration results in a matrix wherein one electrode of a capacitor memory cell is a portion of a row, for example, row 42 of *n*-type semiconductor material while the other electrode is the gate of the column 62. Thus each row 42, 44, etc. forms a common electrode for a number of capacitor cells while the transverse columns 62, 64, 66, etc. provide a common gate to an adjacent number of capacitor memory cells. In such an arrangement, each cell needs no individual contacts, since each row or column is adapted to be connected through an individual switch for transfer of information. Thus high packing density can be achieved.

The rows 52, 54, 56 and 58, etc. of dielectric insulation thus isolate two adjacent MNOS capacitors between adjacent rows, for example between the rows 42 and 44 of *n*-type semiconductor material. These rows of insulation are not *p*-type layers of semiconductor material as in conventional integrated circuits because the most negative potential of the *p*+ isolation barrier could inhibit the MNOS charge transfer action. The use of silicon dioxide as the isolation layer overcomes the problem. The semiconductor structure as shown in FIG. 4 is adapted to provide a matrix having for example a $5 \times 10^{-6}$ meter gate width and a $5 \times 10^{-6}$ meter isolation row width which results in a capacitor cell occupying an area in the order of $100 \times 10^{-6}$ square meters which is the magnitude smaller than current semiconductor memories. In addition, the capacitors do not consume any steady state power which results in less heating and greater reliability.

Figures 5, 6:
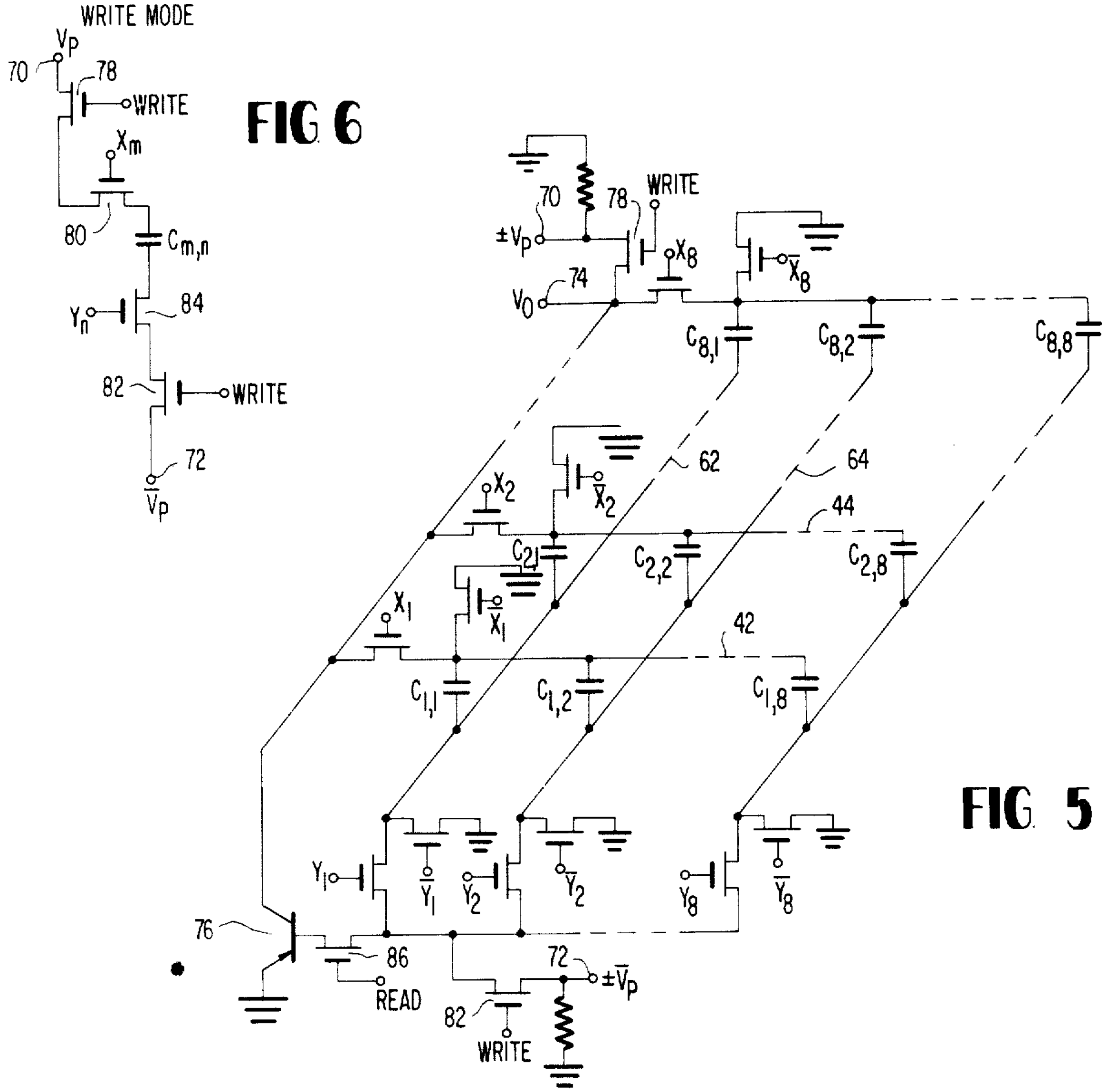
FIG. 5 is an electrical schematic diagram of a transistor matrix adapted to be provided by the structure shown in FIG. 4.
FIG. 6 is an electrical schematic diagram illustrative of the circuitry utilized in the WRITE mode of the matrix circuit shown in FIG. 8.

As noted above, the configuration shown in FIG. 4 is adapted to provide a plurality of MNOS capacitors in each of the semiconductor sublayer rows 42, 44, 46, etc. while the columns 62, 64, 66, etc. provide columns of common gates for the respective capacitors subtended thereby. Although means for applying polarizing potentials and address circuitry are not shown in FIG. 4, such a circuit is disclosed for the sake of illustration in FIG. 5. Referring now to FIG. 5, there is disclosed for purposes of illustration an $8 \times 8$ capacitor matrix wherein the capacitors are identified as $C_{x,y}$ wherein $x$ designates the row number and $y$ the column number. Reference numerals 42 and 44 which are shown as lines actually comprise the n type semiconductor sublayer rows 42 and 44 shown in FIG. 4. Likewise, reference numerals 62 and 64 designate lines corresponding to the common gate columns 62 and 64 shown in FIG. 4. The peripheral circuitry comprises a plurality of MNOS transistors which are adapted to operate simply as switches wherein the corresponding designations, for example $X_1$, $\overline{X_1}$, $Y_1$, $\overline{Y_1}$ refer to time related address signals which when applied to the respective gate, renders the device conductive and thus acts as a closed switch. In addition, there include MNOS transistor switches having the respective gates connected to either a R signal for READ, or W signal for WRITE. These latter signals also are adapted to operate the respective MNOS transistor switch. A polarizing voltage $V_p$ is applied to a terminal 70, while its complement $\overline{V}_p$ is applied to terminal 72. The output signal $V_0$ produced during the READ mode appears at terminal 74 which is common to the collector of transistor 76.

For a better understanding of the MNOS capacitor memory shown in FIG. 5 and its operation, reference is now made to FIG. 6 which discloses a typical circuit for addressing and polarizing an MNOS capacitor $C_{m,n}$ during the WRITE mode. The terminal 70 having the polarizing potential $V_p$ is applied to one side of the capacitor $C_{m,n}$ through MNOS transistor switches 78 and 80 which are adapted to have a respective WRITE and $X_m$ address signal applied thereto whereas the other side of the capacitor is coupled to terminal 72 having the polarizing potential $\overline{V}_p$ coupled therethrough through the MNOS transistor switches 82 and 84 which have a WRITE and $Y_n$ address signal applied to the respective gates. The addressed MNOS capacitor $C_{m,n}$ experiences a potential of $|2V_p|$ between the gate and semiconductor sublayer. All other capacitors are coupled to ground by the MNOS transistors having $\overline{X}_x$ and $\overline{Y}_y$ applied thereto.

Figure 8:
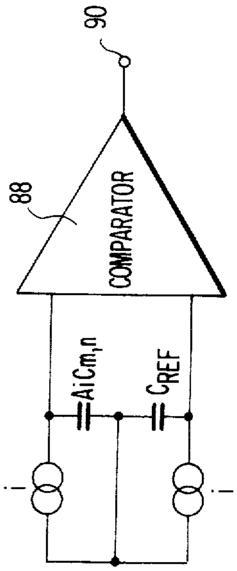
FIG. 8 is an electrical schematic diagram of a circuit adapted to sense the capacitance value of an MNOS capacitor.
Figure 7:
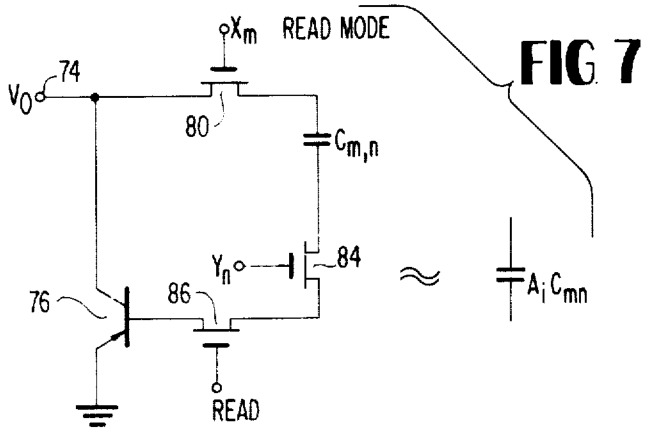
FIG. 7 is an electrical schematic diagram illustrative of the circuit utilized in the READ mode of the circuitry shown in FIG. 8.

In the READ mode, the circuit for the MNOS capacitor $C_{m,n}$ appears as shown in FIG. 7. In this instance the capacitor $C_{m,n}$ is coupled between the collector and base of transistor 76 by means of the ADDRESS MNOS transistor switches 80 and 84 as well as a READ MNOS switch 86. With the switches 80, 84 and 86 closed, the combination of the transistor 76 and the capacitor $C_{m,n}$ appears at terminal 74 as a Miller integrator circuit having a characteristic of providing a current amplification for the capacitor such that the capacitor appears as $A_iC_{m,n}$ which acts to reduce the effect of stray capacitance in the array. $A_i$ is the current amplification provided the transistor 76. The capacitance $A_iC_{m,n}$ can be sensed by comparing it with a reference capacitance in a circuit such as shown in FIG. 8. The reference capacitor may, when desired, be fabricated on the same conductor substrate and by charging the two capacitances from the same source to the most negative threshold voltage as shown in FIG. 2. The difference voltage is fed to a comparator circuit 88 provide an output voltage at terminal 90.

The criss-cross or transverse relationship between common gates and sublayers of semiconductor material arranged in rows separated by rows of dielectric isolation is also adapted to provide an MNOS transistor memory array wherein each row of semiconductor material comprises a sublayer wherein a plurality of transistors have their source and drains connected in series in the respective row while corresponding transistors in adjacent rows share a common gate. Such a semiconductor structure is depicted in FIG. 9 wherein again reference numeral 40 denotes a *p*-type semiconductor substrate upon which are fabricated a plurality of parallel rows 42, 44, etc. of *n*-type semiconductive material separated by contiguous parallel rows of dielectric isolation, for example the row 52 of silicon dioxide ($SiO_2$) is contiguous to rows 42 and 44 of *n*-type semiconductor. MNOS gates 62, 64, etc. traverse to the rows of *n*-type semiconductor material 42, 44, etc. and oxide rows 52, etc. are arranged in parallel columns sandwiched layers 60 and 61 of silicon dioxide ($SiO_2$) and silicon nitride ($Si_3N_4$) formed between the upper surface of the rows and the under surface of the gate material 63. As noted earlier, the parallel columns of gates 62, 64, 66, etc. may be comprised of metal or silicon. In addition, the layers 60 and 61 of $SiO_2$ and $Si_3N_4$ are interrupted at the location of the $SiO_2$ rows 52, 54, etc. and the columns of gates 62, 64, etc., instead of being planar as shown in FIG. 4, now project inwardly to the surface of the rows of $SiO_2$ isolation 52, 54, 56, etc. When desirable, this configuration can be utilized for an MNOS capacitor array as well. The only difference between a capacitor array and a transistor array is that in the latter case diffused regions of opposite semiconductivity type are diffused into the rows of semiconductive material 42, 44, etc. More particularly, for example in row 42 of *n*-type semiconductive material formed on the substrate 40, they are fabricated regions 90, 92, 94, etc. of *p*+ impurites diffused into the surface of the semiconductor row 42 on either side of the gate columns 62, 64, 66, etc. In the same manner, *p*+ impurity dopant is diffused into the *n*-type semiconductor row 44 forming regions 100, 102, 104, etc. Thus, for example, the region 90 may be defined as a source region for the MNOS transistor formed at the gate 62 and therefore the region 92 will then comprise the drain region. Simultaneously, however, the region 92 comprises the source region for the neighboring transistor having a gate formed by the gate column 64 and with the drain formed in the region 94.

Figure 9:
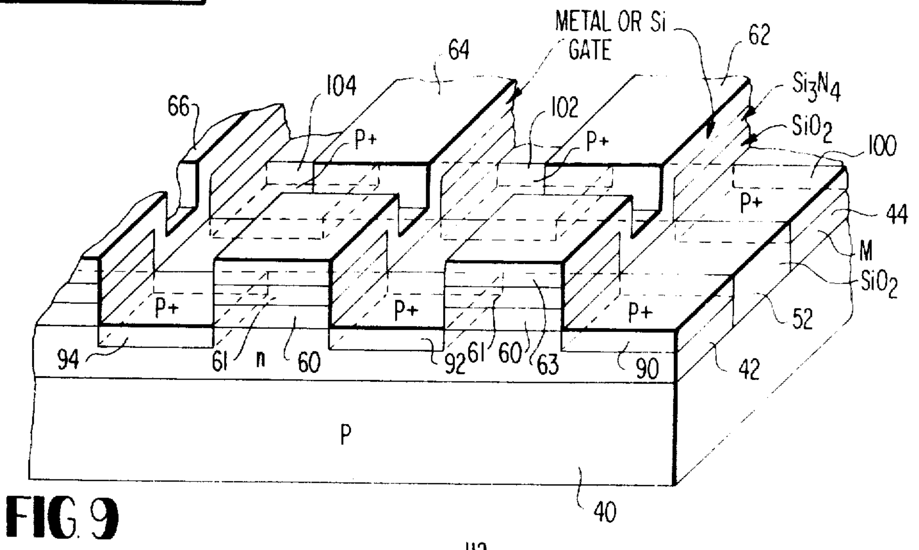
FIG. 9 is a partial perspective view of an MNOS transistor matrix according to the teachings of the subject invention.
Figure 10:
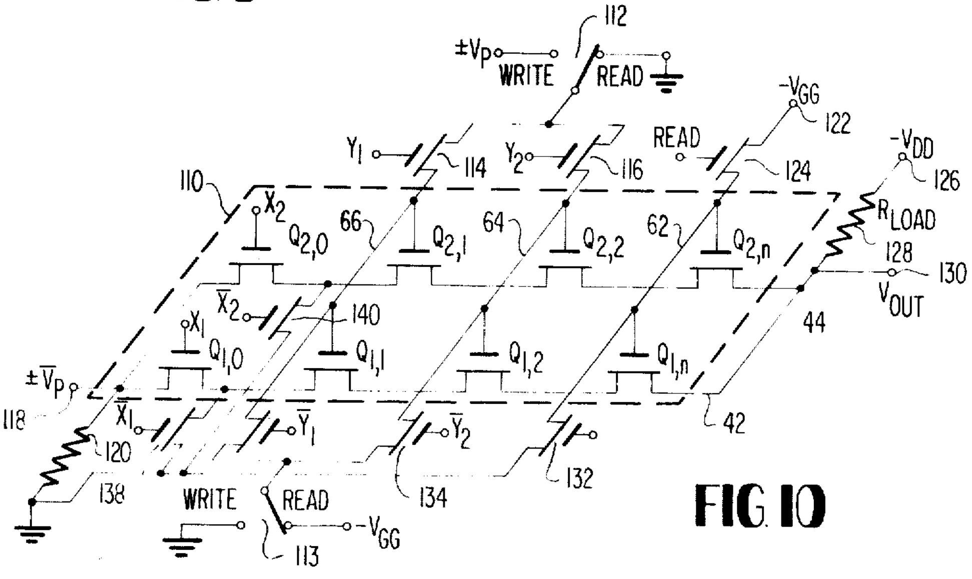
FIG. 10 is an electrical schematic diagram of an MNOS transistor matrix adapted to be provided by the structure shown in FIG. 6.

Schematically, the transistor matrix as formed by the semiconductor structure shown in FIG. 9, is shown in FIG. 10. Reference numeral 110 designates the transistor matrix shown in FIG. 9 and includes parallel rows of MNOS transistors $Q_{1,0}$, $Q_{1,1}$, . . . $Q_{1,n}$ and $Q_{2,0}$, $Q_{2,1}$ . . . $Q_{2,n}$, etc. The transistors $Q_{1,0}$ . . . $Q_{1,n}$ for example would be formed in the row 42 of *n*-type semiconductive material whereas transistors $Q_{2,0}$ . . . $Q_{2,n}$ will be formed in row 44. It can be seen that a column of gate material 62 interconnects the transistor $Q_{1,n}$ and $Q_{2,n}$. Likewise, gate column 64 interconnects the gates of transistors $Q_{1,2}$ and $Q_{2,2}$. The peripheral circuitry is connected to the matrix 110 for addressing a selected transitor and applying a polarization voltage thereto during the WRITE mode and thereafter addressing a selected transistor during the READ mode to determine its resistive value.

The circuitry shown in FIG. 10 for purposes of illustration comprises a 2 × 2 memory incorporating transistors $Q_{1,1}$, $Q_{1,2}$ in the first row and transistor $Q_{2,1}$ and transistor $Q_{2,2}$ in the second row. Transistors $Q_{1,0}$ and $Q_{2,0}$ are utilized for addressing rows 1 and 2 respectively, while transistors $Q_{1,n}$ and $Q_{2,n}$ are utilized for read-out of a particular transistor in rows 1 and 2, respectively. A polarizing voltage $V_p$ and a ground potential is adapted to be alternately applied to the gate columns 64 and 66 by means of a READ/WRITE switch 112 and transistor switches 114 and 116 which are respectively turned ON by the address signals $Y_1$ and $Y_2$. A complementary polarizing voltage $\overline{V}_p$ is connected to terminal 118 which has a resistor 120 coupled to ground. A gate supply voltage $-V_{GG}$ is applied to a terminal 122 and is adapted to be coupled to the gate column 62 by means of an MNOS transistor 24. A drain supply voltage $-V_{DD}$ is coupled to terminal 126 to which is connected a load resistor 128 having an output terminal 130 coupled to the other side thereof. Additionally, gate column 62 has a second MNOS transistor switch 132 coupled to ground potential while gate columns 64 and 66 have a ground potential and the gate supply voltage $-V_{GG}$ alternately applied thereto by means of another READ/WRITE switch 113 and a second MNOS transistor 134 and 136 which are respectively turned ON by address signals $\overline{Y}_1$ and $\overline{Y}_2$. Each row of transistors in the matrix additionally includes an MNOS transistor coupled to ground. For example, as shown in transistors 138 and 140.

As before, the signals associated with each of the gates of MNOS devices shown in FIG. 10 indicates that signal which renders the device conductive, that is turns it ON. During the WRITE mode the switches 112 and 113 move to the WRITE position. The drains of the transistors in rows 42 and 44 are disconnected from the drain supply voltage $-V_{DD}$ due to a WRITE signal being applied to the gate of switch transistor 132 thereby bringing the gate column line 62 to ground potential. The addressed row of transistors, for example the second row, has an address signal $X_2$ applied to the gate of MNOS transistor $Q_{2,0}$ which conducts, causing the potential $\pm\overline{V}_p$ to be applied to the row. The unaddressed row, i.e. the first row, is connected to ground by means of MNOS transistor switch 138. The addressed gate column, for example the first column 66, is coupled to the polarizing voltage $\pm V_p$ through the application of an address signal $Y_1$ to the gate of MNOS switch 114. The unaddressed gate columns 64 and 62 are connected to ground by means of MNOS transistor switches 134 and 132. Thus transistor $Q_{2,1}$ is addressed and is turned ON regardless of the previous state or mode of the transistor. The addressed transistor, moreover, experiences a polarizing potential of $|2V_p|$ between the gate and channel while the unaddressed transistors in the same column experiences a potential of only $|V_p|$ which is insufficient to polarize the MNOS transistors. The other transistors in the other columns have zero voltage impressed between the gate and channel and hence do not experience any change in mode.

Considering now the READ mode, switches 112 and 113 move to the READ position. The READ signal is applied to the gate of MNOS switch 124 which conducts, causing the gate supply potential $-V_{GG}$ to be applied to the gate column 62. The gates of all the unaddressed columns are now connected to $-V_{GG}$ which acts to turn the switches ON. The gates of the addressed column, however, is connected to ground. If the addressed transistor is in the depletion mode, i.e. binary 1 state, the transistor is ON and the output voltage $V_{OUT}$ at terminal 130 is substantially at ground potential. On the other hand, if the addressed transistor is in the enhancement mode, i.e. OFF, the binary 0 state, the output signal $V_{OUT}$ is at $-V_{DD}$.

Figure 11:
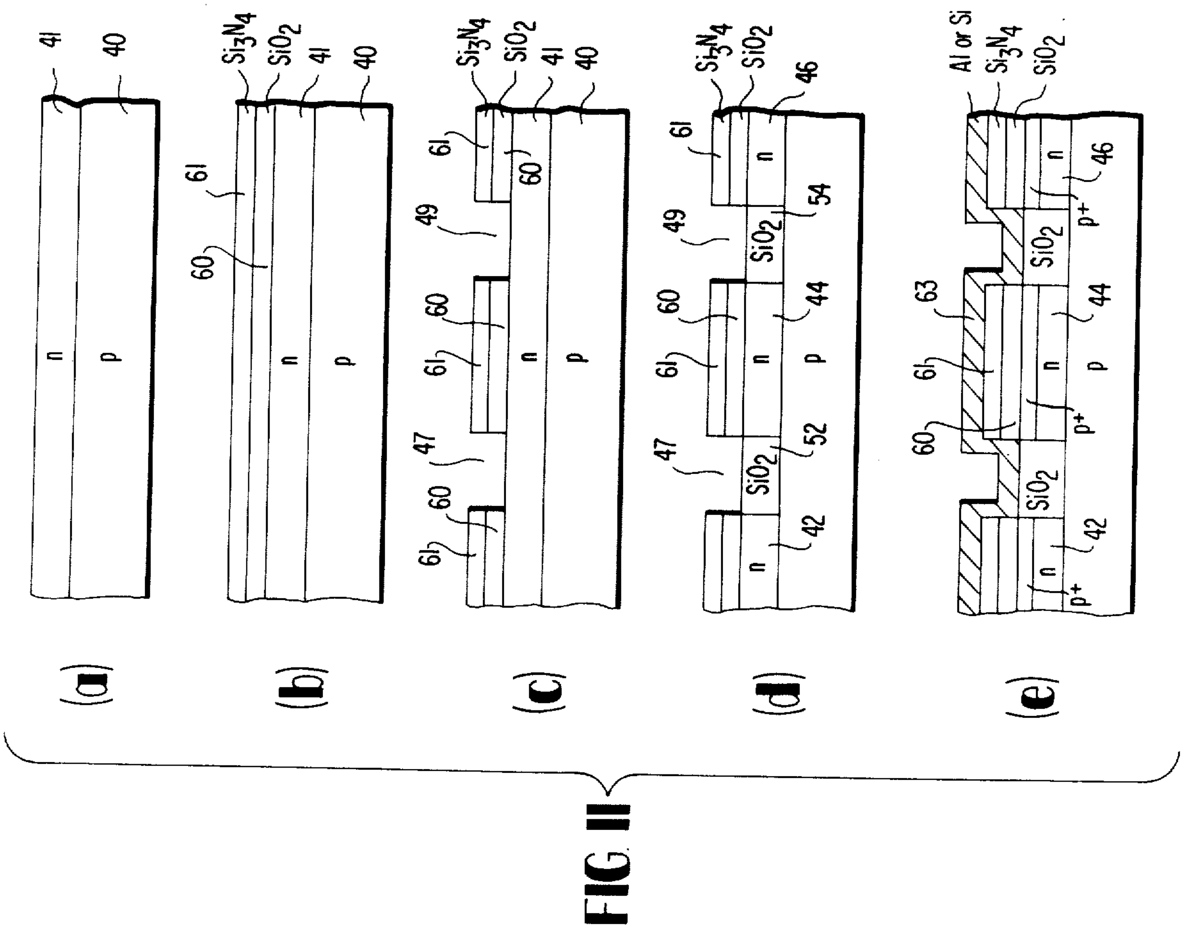
FIGS. 11(*a*)–11(*e*) is a set of partial cross sectional views illustrative of the method of fabrication of the subject invention.

Referring now to FIGS. 11*a* through 11*e*, there is disclosed what is at present considered to be the preferred method of fabricating an MNOS memory having rows of $SiO_2$ dielectric isolation formed between epitaxial rows of semiconductive material fabricated on the substrate and with columns of gates formed transversely across the underlying rows. In FIG. 11*a*, a thin *n*-type epitaxial layer 41 of semiconductor material in the order of 1–2 microns thick and having a resistivity in the order of 10 ohms-cm. is grown on the *p*-type substrate 40. Following this, a thin oxide layer 60 e.g. silicon dioxide $(SiO)_2$ is deposited on the surface of the epitaxial layer 41, followed by a thin layer 61 of dielectric e.g. silicon nitride $(Si_3N_4)$ deposited on the surface of the oxide layer 60. Channel windows 47 and 49 having the desired width of the rows of isolation 52, 54, to be subsequently formed are opened to the surface of the epitaxial layer 41 by suitable masking and etching through the nitride layer and oxide layers 61 and 60 as shown by FIG. 11*c*. Following this, the wafer is subjected to a step of thermal oxidation, such as by passing steam thereat at high temperature. The steam oxidizes through the *n*-type epitaxial layer 41 at the location of the windows 47 and 49 since the steam cannot penetrate through the outer surface of the nitride layer 61. Accordingly, rows of dielectric isolation 52, and 54, etc. are formed leaving separated rows 42, 44, etc. of n type semiconductor therebetween. Next, a layer 63 of gate material e.g. aluminum or silicon is formed over the entire surface of the wafer as shown in FIG. 11*e* and another masking and etching step takes place for forming the gate columns 62, 64 and 66, such as shown in FIG. 9, through the layer 63 of gate material, the nitride layer 61 and the oxide layer 60. The resulting MNOS structure at this stage results in the formation of an array of MNOS capacitors; however, by proceeding one step further and diffusing into the rows of *n*-type semiconductor materials 42, 44, 46, not covered by the columns of sandwiched layers 60, 61 and 63 with for example *p+* dopant there is provided regions which result in an MNOS transistor structure as shown in FIG. 9. The resulting integrated semiconductor structure is then in condition for having suitable electrode contacts and interconnecting circuitry coupled thereto.

Having thus described what is at present considered to be the preferred embodiments of the subject invention, as well as its preferred method of fabrication, it should be noted that the foregoing detailed description has been made by way of illustration only, and is not meant to be considered in a limiting sense, since various other modifications may be resorted to without departing from the spirit and scope of the invention as defined in the following claims. Accordingly,

I claim as my invention:

1. An array of MNOS devices having binary logic operating states thereby being adapted to operate as a matrix of discrete storage cells, the improvement comprising:

a body of first type semiconductor material;

a continuous planar epitaxial layer of substantially uniform thickness formed on the surface of said body consisting of a plurality of active regions comprising alternate rows of second type semiconductive material, separated by contiguous inactive regions comprising intervening rows of dielectric isolation material, said rows extending through the entire thickness of the epitaxial layer;

a plurality of separated columns of MNOS gates extending substantially transversely across said rows of second type semiconductive material and said rows of dielectric isolation material, said columns each comprising gate material separated from said rows by respective columns of substantially the same width dimension as said gate material of a first layer of dielectric material contiguous with said rows and a second layer of dielectric material contiguously sandwiched between said first layer of dielectric material and said gate material, each gate portion and the active region subtended thereby comprising a separate storage cell having a capacitive node.

2. The array of MNOS devices as defined by claim 1 and additionally including regions of first type semiconductivity diffused in said active regions adjacent and between said columns of MNOS gates defining drain and source regions of series connected transistors in each row of second type of semiconductor material.

3. The array of MNOS devices as defined by claim 1 wherein said body of first type semiconductive material is comprises of a substrate of *p*-type semiconductive material, said plurality of rows of second type semiconductive material is comprised of *n*-type semiconductive material, said isolation regions of dielectric material and said first layer of dielectric material is comprised of silicon dioxide, and said second layer of dielectric material is comprised of silicon nitride.

4. The array of MNOS devices as defined by claim 3 and additionally including diffused regions of p type semiconductivity in said rows of *n*-type semiconductivity material adjacent and between said columns of MNOS gates.

5. The array of MNOS devices as defined by claim 1 wherein said gate material is comprised of conductive metal, said first layer of dielectric material is comprised of silicon dioxide, and said second layer of dielectric material is comprised of silicon nitride.

6. The array of MNOS devices as defined by claim 5 and additionally including diffused regions of first type semiconductivity diffused in said rows of second type semiconductive material adjacent and between said columns of MNOS gates.

7. The array of MNOS devices as defined by claim 1 wherein said gate material is comprised of silicon, said first layer of dielectric material is comprised of silicon dioxide, and said second layer of dielectric material is comprised of silicon nitride.

8. The array as defined by claim 7 and additionally including regions of first type semiconductivity diffused in said rows of second type semiconductive material between and adjacent said columns of silicon gate material, said first layer of silicon dioxide and said second layer of silicon nitride.

9. The array of MNOS devices as defined by claim 1 wherein said plurality of rows of semiconductive material and dielectric isolation material are comprised of substantially parallel alternating rows and said plurality of columns of gate material together with the respective columns of first and second layers of dielectric material are comprised of substantially parallel columns of substantially constant separation.

10. The array of MNOS devices as defined by claim 1 wherein said isolation regions of dielectric material are comprised of regions of silicon dioxide contiguous with the respective adjacent rows of second type semiconductor material, said uniform thickness providing a planar outer surface over which are formed said transverse columns of MNOS gates in substantially equally spaced relationship.

* * * * *